(12) United States Patent
Ueno et al.

(10) Patent No.: US 9,048,157 B2
(45) Date of Patent: Jun. 2, 2015

(54) SOLID-STATE IMAGING DEVICE AND PORTABLE INFORMATION TERMINAL

(75) Inventors: Risako Ueno, Tokyo (JP); Hideyuki Funaki, Tokyo (JP); Mitsuyoshi Kobayashi, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 292 days.

(21) Appl. No.: 13/221,061

(22) Filed: Aug. 30, 2011

(65) Prior Publication Data

US 2012/0218448 A1 Aug. 30, 2012

(30) Foreign Application Priority Data

Feb. 25, 2011 (JP) .................................. 2011-040254

(51) Int. Cl.
*H04N 3/14* (2006.01)
*H04N 5/225* (2006.01)
*H01L 27/146* (2006.01)

(52) U.S. Cl.
CPC .............................. *H01L 27/14627* (2013.01)

(58) Field of Classification Search
None
See application file for complete search history.

(56) References Cited

U.S. PATENT DOCUMENTS

| | | | |
|---|---|---|---|
| 2005/0135798 A1* | 6/2005 | Szajewski et al. | 396/335 |
| 2008/0309813 A1* | 12/2008 | Watanabe | 348/340 |
| 2011/0273600 A1* | 11/2011 | Kriman et al. | 348/294 |
| 2012/0019669 A1* | 1/2012 | Bai et al. | 348/187 |
| 2012/0050589 A1 | 3/2012 | Ueno et al. | |
| 2012/0057020 A1 | 3/2012 | Kobayashi et al. | |
| 2012/0062771 A1 | 3/2012 | Ueno et al. | |
| 2013/0063641 A1* | 3/2013 | Venezia et al. | 348/308 |
| 2013/0128081 A1* | 5/2013 | Georgiev et al. | 348/240.2 |
| 2013/0128087 A1* | 5/2013 | Georgiev et al. | 348/307 |

FOREIGN PATENT DOCUMENTS

JP 5214754 B 3/2013

OTHER PUBLICATIONS

Keith Fife, et al., "A 3D Multi-Aperture Image Sensor Architecture", IEEE 2006 Custom Intergrated Circuits Conference (CICC), 2006, 4 Pages.
Office Action issued Jan. 24, 2014 in Japanese Patent Application No. 2013-034953 (with English Translation).

* cited by examiner

*Primary Examiner* — Lin Ye
*Assistant Examiner* — John H Morehead, III
(74) *Attorney, Agent, or Firm* — Oblon, Spivak, McClelland, Maier & Neustadt, L.L.P.

(57) ABSTRACT

A solid-state imaging device according to an embodiment includes: an imaging element formed on a semiconductor substrate, and comprising an imaging region including a plurality of pixel blocks each including a plurality of pixels; a first optical system forming an image of an object on an imaging plane; and a second optical system comprising a microlens array including a plurality of microlenses each corresponding to one of the pixel blocks, and reducing and re-forming the image to be formed on the imaging plane on the pixel blocks corresponding to the respective microlenses. The imaging plane of the first optical system is located further away from the first optical system than the imaging element when the object is located at an infinite distance.

10 Claims, 8 Drawing Sheets

SOLID-STATE IMAGING DEVICE AND PORTABLE INFORMATION TERMINAL

CROSS-REFERENCE TO RELATED APPLICATION

This application is based upon and claims the benefit of priority from prior Japanese Patent Application No. 2011-40254 filed on Feb. 25, 2011 in Japan, the entire contents of which are incorporated herein by reference.

FIELD

Embodiments described herein relate generally to a solid-state imaging device that is capable of obtaining a two-dimensional visible image and depth-direction distance information about the object at the same time, and to a portable information terminal.

BACKGROUND

Various techniques such as a technique using reference light and a stereo distance measuring technique using two or more cameras have been suggested as imaging techniques for obtaining information about the distance to an object in the depth direction as two-dimensional array information. Particularly, in recent years, there has been an increasing demand for relatively inexpensive products as novel consumer input devices.

In view of this, an imaging device that has a multi-view structure and includes an imaging lens has been suggested as a structure for obtaining a large number of parallaxes from multiple viewpoints, and restraining a decrease in resolution. This imaging device has an imaging lens, for example, and has a multiple optical system as an image re-forming optical system located between the imaging lens and an imaging element. As the multiple optical system, a microlens array or the like having a large number of minute lenses formed on a flat surface is used. Pixels for obtaining the images of the microlenses are provided at corresponding locations below the respective microlenses. An image formed at the imaging lens is re-formed on the imaging element through the image re-forming microlenses, and the re-formed single-view image is an image having a shift in viewpoint. The shift is equivalent to the parallaxes existing because of the locations of the microlenses.

By performing image processing on parallax images obtained through the large number of microlenses, the distance to the object can be estimated by using the principle of triangulation. Further, by performing image processing to combine such parallax images, the parallax images can be re-formed as a two-dimensional image.

In the above-described imaging device having a multi-view structure, however, the focal plane of the imaging lens is shifted forward (toward the object) to a position before the imaging element when the object is located at an infinite distance. Therefore, when the same imaging lens as above is used, camera height is increased.

DETAILED DESCRIPTION

A solid-state imaging device according to an embodiment includes: an imaging element formed on a semiconductor substrate, and comprising an imaging region including a plurality of pixel blocks each including a plurality of pixels; a first optical system forming an image of an object on an imaging plane; and a second optical system comprising a microlens array including a plurality of microlenses each corresponding to one of the pixel blocks, and reducing and re-forming the image to be formed on the imaging plane on the pixel blocks corresponding to the respective microlenses. The imaging plane of the first optical system is located further away from the first optical system than the imaging element when the object is located at an infinite distance.

The following is a description of embodiments of the present invention, with reference to the accompanying drawings.

(First Embodiment)

Figure 1:
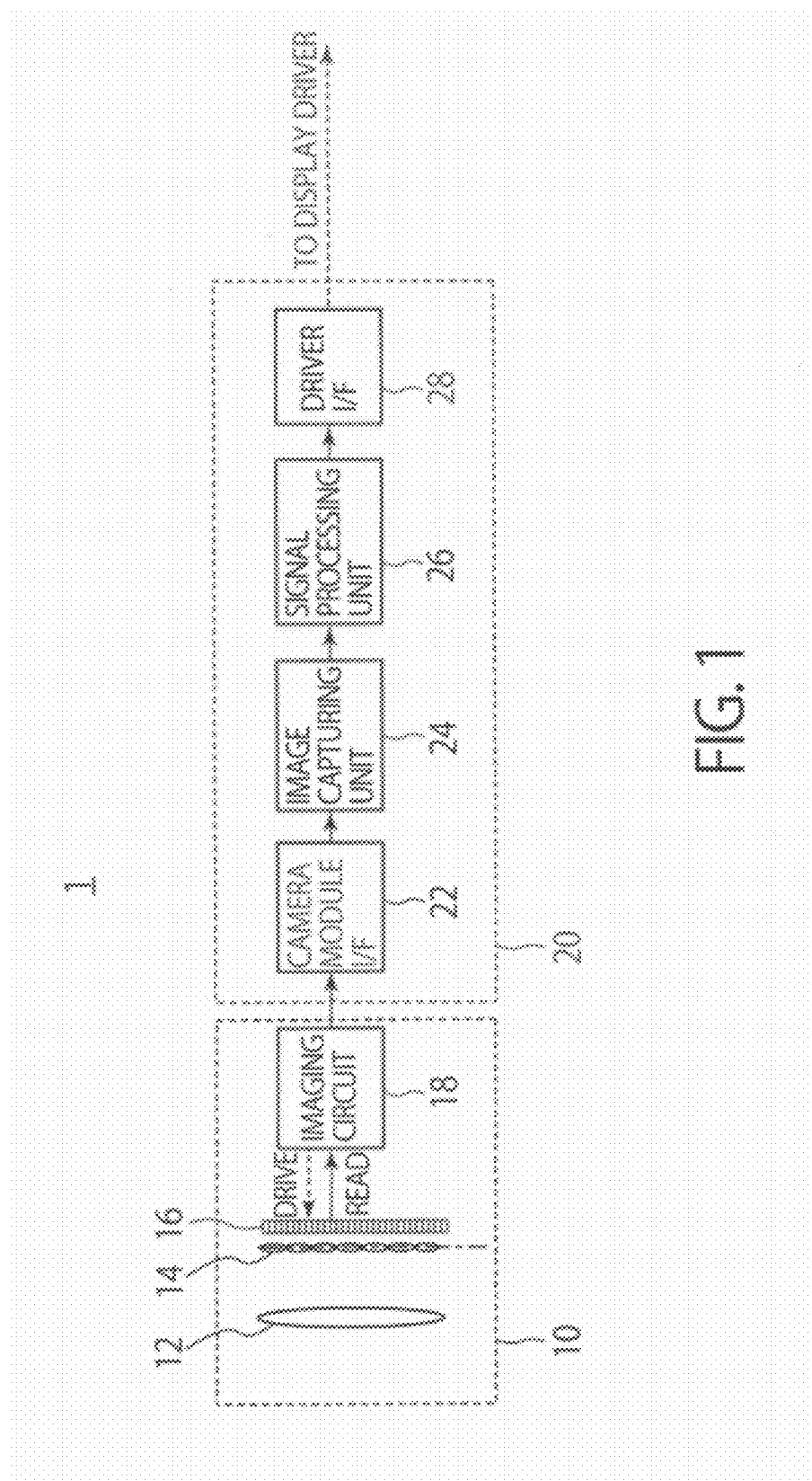
FIG. 1 is a block diagram showing a solid-state imaging device according to a first embodiment.

FIG. 1 shows a solid-state imaging device (a camera module) 1 according to a first embodiment. The solid-state imaging device 1 of the first embodiment includes an imaging module unit 10 and an image signal processor (hereinafter also referred to as ISP) 20.

The imaging module unit 10 includes an imaging optics 12, a microlens array 14, an imaging element 16, and an imaging circuit 18. The imaging optics 12 functions as an imaging optical system that captures light from an object into the imaging element 16. The imaging element 16 functions as an element that converts the light captured by the imaging optics 12 to signal charge, and has pixels (such as photodiodes serving as photoelectric conversion elements) arranged in a two-dimensional array. The microlens array 14 is a microlens array that includes microlenses or a microoptical system including prisms, for example. The microlens array 14 functions as an optical system that reduces and re-forms a group of light rays formed on the imaging plane by the imaging optics 12, on pixel blocks corresponding to the respective microlenses. The imaging circuit 18 includes a drive circuit component (not shown) that drives the respective pixels of the pixel array of the imaging element 16, and a pixel signal processing circuit component (not shown) that processes signals output from the pixel region. The drive circuit component includes a vertical select circuit that sequentially selects pixels to be driven by the horizontal line (row) in the vertical direction, a horizontal select circuit that sequentially selects pixels by the column, and a TG (timing generator) circuit that drives those select circuits with various pulses. The pixel signal processing circuit component includes an AD converter circuit that converts analog electric signals supplied from the pixel region into digital signals, a gain adjustment/amplifier circuit that performs gain adjustments and amplifying operations, and a digital signal processing circuit that performs corrections and the like on digital signals.

The ISP 20 includes a camera module interface 22, an image capturing unit 24, a signal processing unit 26, and a driver interface 28. A RAW image obtained through an imaging operation performed by the imaging module unit 10 is captured from the camera module interface 22 into the image capturing unit 24. The signal processing unit 26 performs signal processing on the RAW image captured into the image capturing unit 24. The driver interface 28 outputs the image signal subjected to the signal processing performed by the signal processing unit 26, to a display driver (not shown). The display driver displays the image formed by the solid-state imaging device.

Figure 2:
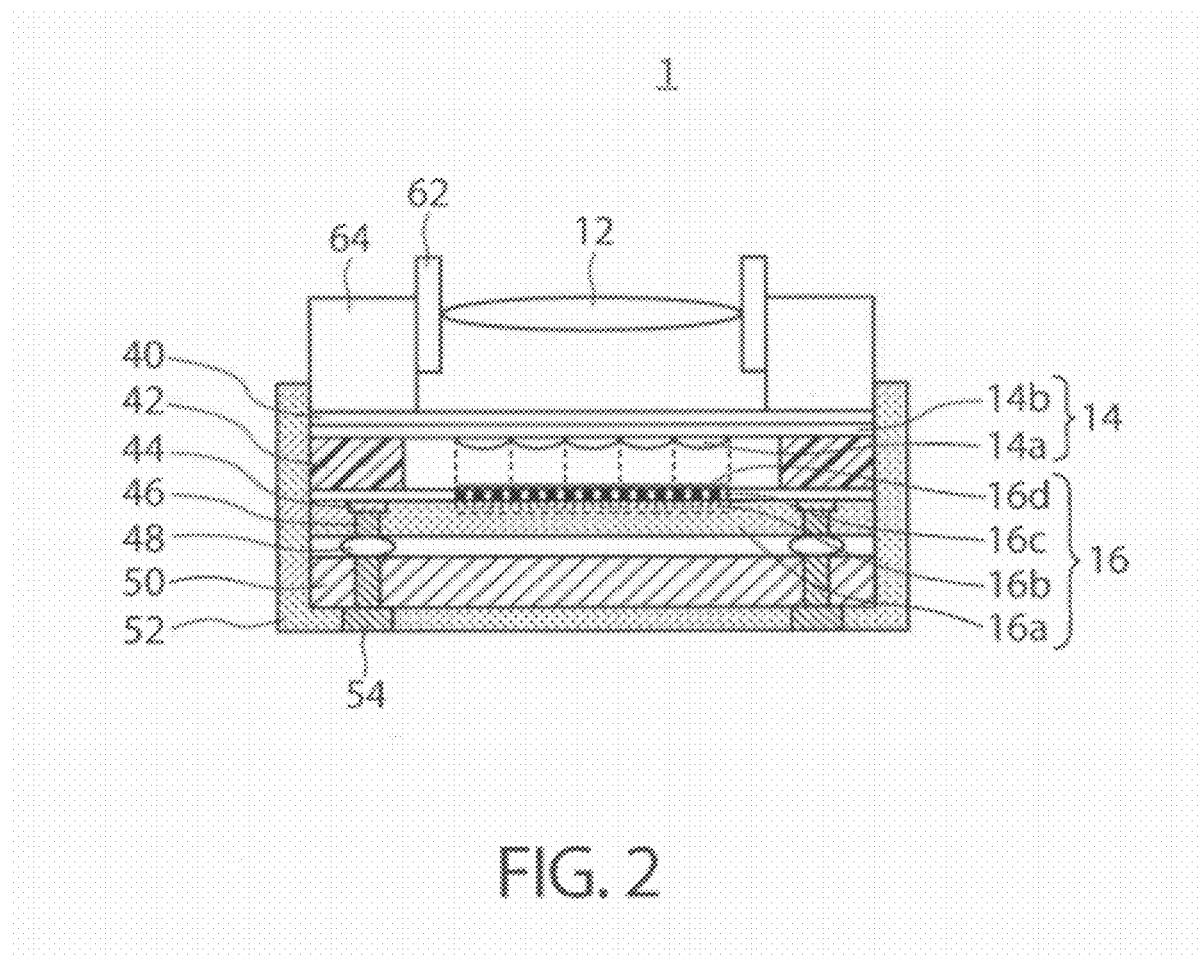
FIG. 2 is a cross-sectional view of the solid-state imaging device of the first embodiment.

FIG. 2 is a cross-sectional view of the solid-state imaging device 1 according to the first embodiment. As shown in FIG. 2, in the solid-state imaging device 1 of the first embodiment, the imaging element 16 is formed on a semiconductor substrate 16a. Pixels 16b including photodiodes are formed on the semiconductor substrate 16a, and a drive/read circuit (not shown) that drives the pixels 16b and reads signals from the pixels 16b is also formed on the semiconductor substrate 16a. Color filters 16c of R (red), G (green), and B (blue) corresponding to the respective pixels 16b are formed on the pixels 16b in an arrangement such as a Bayer arrangement. On the color filters 16c, microlenses 16d for collecting pixel light may be formed for the respective pixels.

A visible light transmissive substrate 40 that has the microlens array 14 attached thereto and transmits visible light is provided above the color filters 16c. The visible light transmissive substrate 40 may have a multilayer film or a single-layer film that transmits visible light but reflects near-infrared light. The microlens array 14 includes a microlens unit 14a formed on a microlens array substrate 14b. The microlens unit 14a is placed on the side of the imaging element 16, when seen from the visible light transmissive substrate 40, and includes microlenses. The respective microlenses correspond to the pixel blocks formed by the pixels provided on the semiconductor substrate 16a, and function as an optical system that reduces and forms an image on the corresponding pixel blocks. The visible light transmissive substrate 40 is also joined to the semiconductor substrate 16a with a resin spacer 42 provided around the imaging region having the pixels 16b formed therein. The positioning for joining the semiconductor substrate 16a and the visible light transmissive substrate 40 to each other is performed based on positioning marks or the like. The visible light transmissive substrate 40 may be made of a material that cuts off unnecessary near-infrared light or may have a film that cuts off near-infrared light.

In the semiconductor substrate 16a, read electrode pads 44 for the pixels 16c are formed, and through electrodes 35 that penetrate through the semiconductor substrate 16a are formed under the electrode pads 44. The semiconductor substrate 16a is electrically connected to a chip 50 via the through electrodes 46 and bumps 48. A driving/processing circuit (the imaging circuit 18) that drives the imaging device and processes read signals is formed in the chip 50.

The imaging lens 12 is provided above the visible light transmissive substrate 40. The imaging lens 12 is attached to a lens barrel 62, and the lens barrel 62 is attached to a lens holder 64. The lens holder 64 is joined to the peripheral region of the visible light transmissive substrate 40. When the imaging lens 12 is attached to the lens barrel 62, the focal length of the lens 12 may be adjusted in accordance with the relationship between the pressing force and the output image. A light shielding cover 52 for shielding unnecessary light is attached to the peripheries of the semiconductor substrate 16a, the visible light transmissive substrate 40, and the chip 50. Module electrodes 54 that electrically connect the chip 50 and the outside are formed in the light shielding cover 52. However, the present invention is not limited to the above described structure, and the electrode pads 48 may be electrically connected to an external chip by wire bonding or the like.

(Relationship Between Object Distance and Light Rays)

Referring now to FIGS. 3(a) and 3(b), the relationship between the distance to an object and the group of light rays in an optical system (a virtual image optical system) of the solid-state imaging device 1 of this embodiment is described.

Normally, in a conventional solid-state imaging device (a camera module) of a conventional fixed focus type, the distance between the image-side principal surface of the imaging lens and the imaging element is made nearly equal to the focal length f of the imaging optics. Accordingly, the distance between a photographable object and the camera is in the range of the shortest image pick-up distance at which image blurring is on the highest allowable level, to an infinite distance.

In the solid-state imaging device 1 of this embodiment, on the other hand, the imaging element 16 is positioned so that the distance between the image-side principal surface 12a of the imaging lens 12 and the imaging element 16 becomes shorter than the focal length f of the imaging optics (the imaging lens 12), as shown in FIG. 3(a). That is, when the microlens array 14 is not provided, an imaging plane 70 is located behind the imaging element 16 when the object is at an infinite distance, and a focused image cannot be picked up by the imaging element 16. The imaging plane 70 when the microlens array 14 is not provided is called a virtual imaging plane. In this embodiment, however, the microlens array 14 is provided between the imaging lens 12 and the imaging element 16, so that the light ray group consisting of a principal ray 80 and peripheral rays 82 is refracted, and the light ray group forms an image on the surface of the imaging element 16 located before the virtual imaging plane 70. At this point, the image to be formed on the virtual imaging plane 70 by the imaging lens 12 is reduced and picked up by the microlenses 14a. The reduction rate serves as the indicator of degradation of the optical resolution, but this will be described later.

FIG. 3(b) shows the positional relationship between the imaging lens 12 and the virtual imaging plane 70 when an object 100 is located at a finite distance A. As shown in FIG. 3(b), when the object 100 is at a shorter distance than an infinite distance, the virtual imaging plane 70 is located even further behind the imaging element 16 than when the object 100 is located at the infinite distance. Even in such a case, the light ray group to form an image on the virtual imaging plane 70 forms an image on the surface of the imaging element 16 through the microlenses 14a. In FIGS. 3(a) and 3(b), LML represents the pitch of the microlenses 14a.

The distance D at which the microlenses 14a perform image re-formation varies between the case where the object 100 is located at the infinite distance and a case where the object 100 is located at the finite distance. However, the variation is sufficiently smaller than the variation of the distance A from the object 100 to the imaging lens 12, and therefore, the variation of the distance D is regarded as being within the depth of focus.

As described above, the virtual imaging plane 70 of the imaging lens 12 is located behind the imaging element 16, so that the distance between the imaging lens 12 and the imaging element 16 can be made shorter than that in the conventional case where the virtual imaging plane 70 is located before the microlens array 14. Accordingly, the height of a camera module can be made smaller when an imaging lens having the same optical properties as above is used.

Further, the distance between the imaging lens 12 and the imaging element 16 has a smaller designed value than that in a conventional camera optical system having no microlenses. Accordingly, the height of a camera module can be made smaller when an imaging lens having the same optical properties as above is used.

(Relational Expression of Geometric Optics in Solid-State Imaging Device of First Embodiment)

Figure 3:
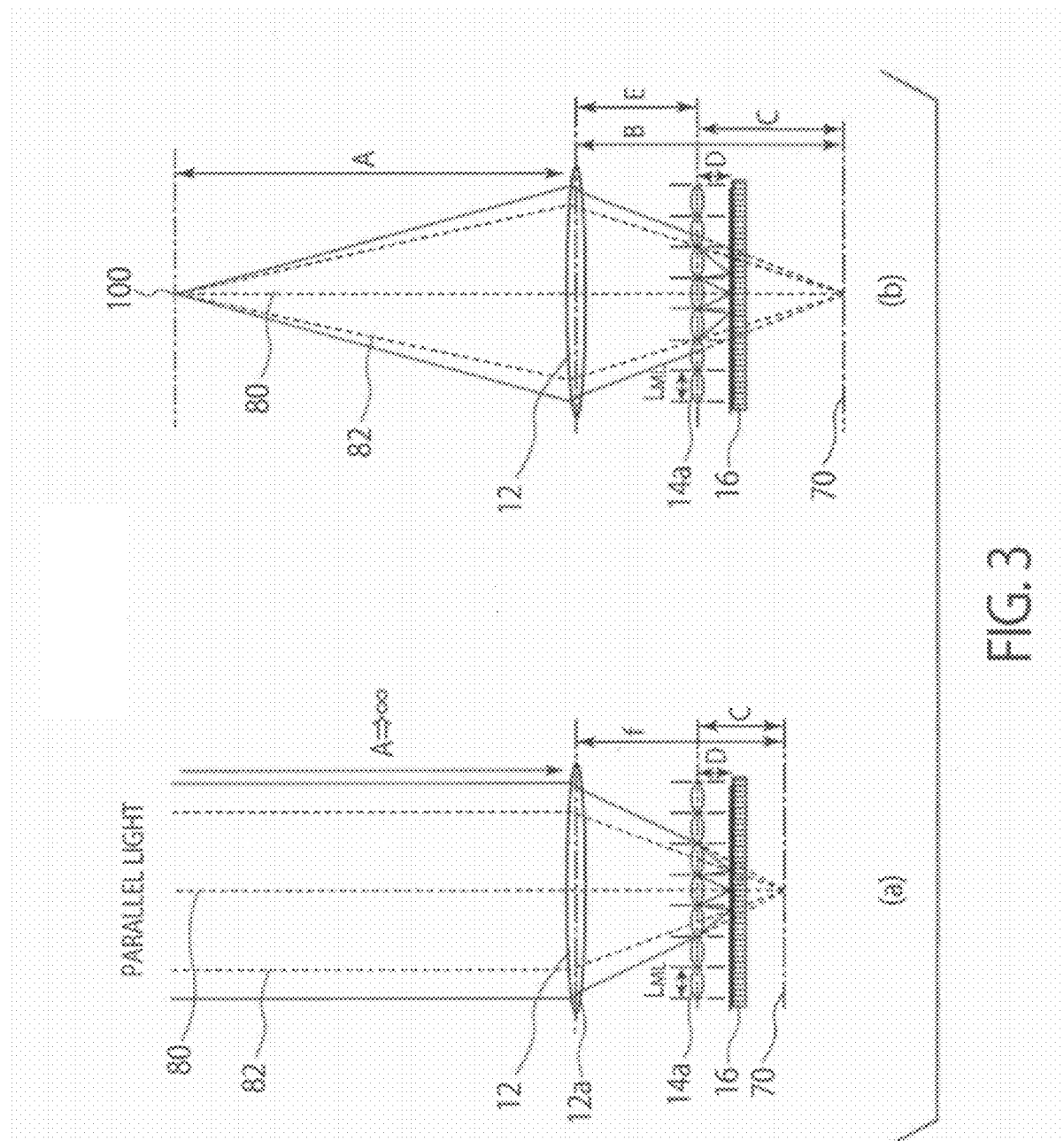
FIGS. 3(a) and 3(b) are diagrams for explaining the relationship between the distance from the imaging lens to an object and light rays in the first embodiment.
Figure 4:
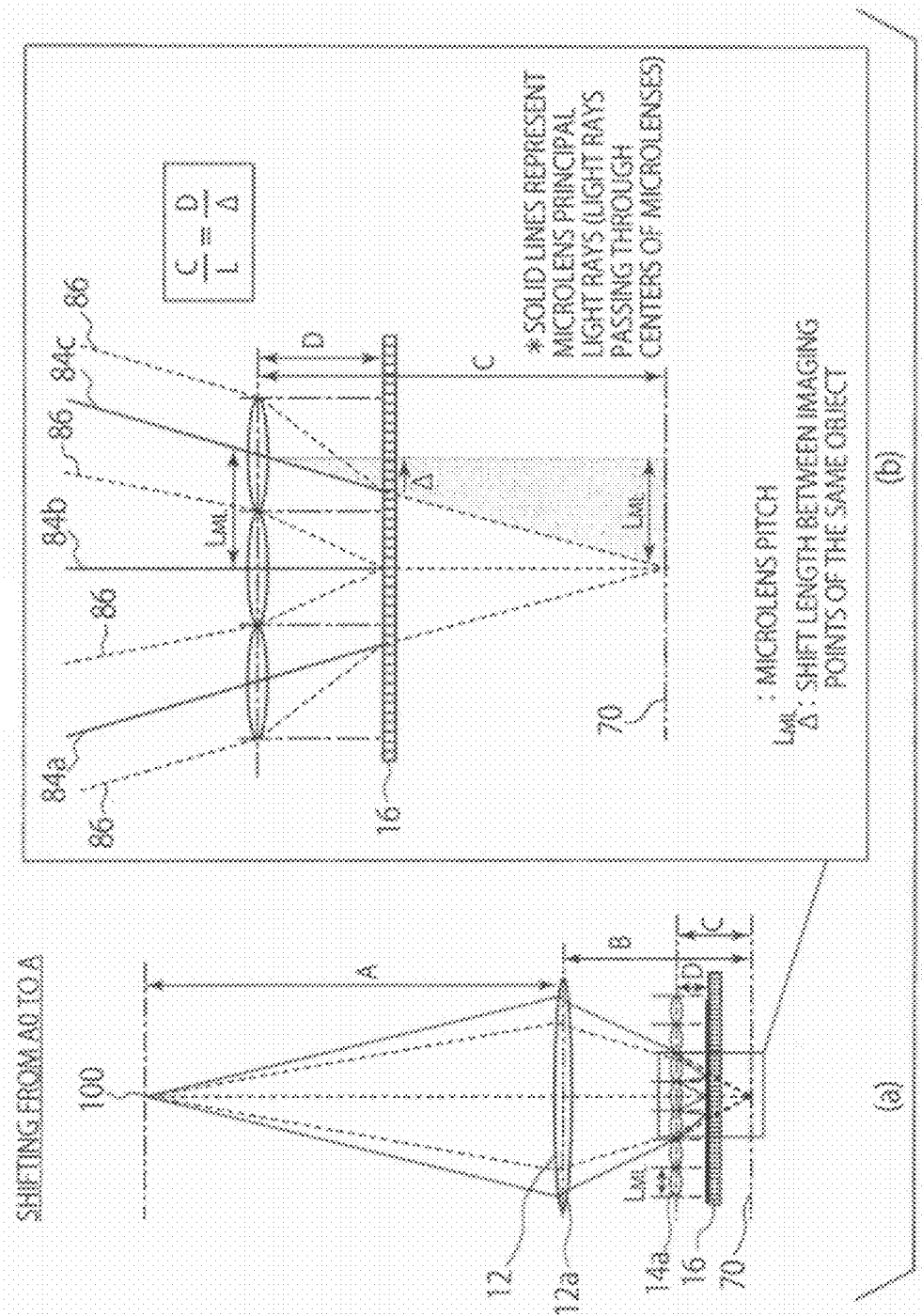
FIGS. 4(a) and 4(b) are diagrams for explaining the geometric optical relationship of microlenses at the center of the optical axis of the imaging lens in the first embodiment.

Referring now to FIGS. 3, 4(a), and 4(b), the relationship of the geometric optics in the optical system (the virtual optical system) of the solid-state imaging device 1 of this embodiment is described. For ease of explanation, only a paraxial region is described herein. It should be noted that FIG. 4(b) is an enlarged view of the paraxial region of the microlenses shown in FIG. 4(a).

Where attention is paid only to the imaging optics (the imaging lens) 12, the principal ray 80 and its peripheral rays 82 from the object 100 forms an image on the virtual imaging plane 70 determined from the focal length f of the imaging optics 12 and the distance between the imaging optics 12 and the object 100, so that the following relationship expressed by the following equation (1) is satisfied:

$$\frac{1}{f} = \frac{1}{A} + \frac{1}{B} \tag{1}$$

where f represents the focal length of the imaging lens 12, A represents the distance from the object-side principal surface 12b of the imaging lens 12 to the object 100, and B represents the distance from the image-side principal surface 12a of the imaging lens 12 to the virtual imaging plane 70.

The imaging magnification (the lateral magnification) of the imaging lens 12 is expressed by the following equation:

$$M = \frac{B}{A} \tag{2}$$

In this embodiment, the virtual imaging plane 70 of the imaging lens 12 is located further behind the imaging element 16 (on the opposite side of the imaging element 16 from the object 100). Since the microlenses 14a is positioned before the virtual imaging plane 70, light is collected onto the surface of the imaging element 16 that is located before the virtual imaging plane 70 and has pixels formed thereon. At this point, the light rays 80 and 82 form a reduced image as a virtual image. The imaging system of the microlenses 14a is expressed by the following equation:

$$\frac{1}{g} = -\frac{1}{C} + \frac{1}{D} \tag{3}$$

where g represents the focal length of the microlenses 14a, C represents the distance from the object-side principal surface of the microlenses 14a to the virtual imaging plane 70, and D represents the distance from the image-side principal plane of the microlenses 14a to the imaging element 16. At this point, the imaging magnification of the imaging system of the microlenses 14a is expressed by the following equation (4):

$$N = \frac{D}{C} \tag{4}$$

The variable E of the following equation (5) is then introduced according to a geometric relationship. In a case where the optical system is a fixed-focus optical system, the variable E is a fixed designed value.

$$E = B - C \tag{5}$$

When two adjacent microlenses 14a are selected, the array pitch of the microlenses 14a or the distance between the microlenses 14a is represented by LML. Light rays 84a, 84b, 84c, and 86 emitted from the same object form an image on adjacent respective microlenses 14a. The pitch LML and the shift length Δ on one side are expressed by the following equation (6) according to the geometric relationships of the main light rays 84a, 84b, and 84c with respect to the respective microlenses 14a shown in FIG. 4(b):

$$\frac{C}{L_{ML}} = \frac{D}{\Delta} \tag{6}$$

Using the above parameters, the variations of the respective parameters (B, C, D, and A) with respect to shifting of the object (a variation of A) are described. The distance from the imaging lens 12 to a photographable object is represented by A0, and parameters having the subscript "0" on the lower right sides thereof (B0, C0, D0, and Δ0) represent the values obtained when the distance from the imaging lens 12 to the object is A0. Once A0 is determined, the above parameters are uniquely determined at the same time as A0, if the optical system is a fixed-focus optical system.

The variation of the parameter D obtained when the distance from the imaging lens 12 to the object is changed from A0 to A is presented by M (the imaging lens magnification). According to the equations (1) through (5), the imaging lens magnification M satisfies the relationship expressed by the following equation (7):

$$\begin{aligned} D &= \left(\frac{1}{g} + \frac{1}{C}\right)^{-1} \\ &= \left(\frac{1}{g} + \frac{1}{(B-E)}\right)^{-1} \\ &= \left(\frac{1}{g} + \frac{1}{B - (B_0 - C_0)}\right)^{-1} \\ &= \left(\frac{1}{g} - \frac{1}{-\frac{D_0}{N_0} + (M_0 - M)f}\right)^{-1} \end{aligned} \tag{7}$$

According to the equations (1), (2), (6), and (7), the shift length Δ between the distance A from the imaging lens 12 to the object and the image satisfies the relationship expressed by the following equation (8):

$$A = \left(\frac{1}{f} - \frac{1}{B}\right)^{-1} \quad (8)$$

$$= \left(\frac{1}{f} - \frac{1}{B_0 - C_0 + C}\right)^{-1}$$

$$= \left(\frac{1}{f} - \frac{1}{(M_0 + 1)f - \frac{D_0}{N_0} + \frac{L_{ML}D}{\Delta}}\right)^{-1}$$

The shift length $\Delta$ and the magnification M satisfy the relationship expressed by the following equation (9):

$$\Delta = \frac{DL_{ML}}{(M_0 - M)f - \frac{D_0}{N_0}} \quad (9)$$

As the distance A to the object becomes longer or as the distance A becomes closer to ∞, the magnification M becomes closer to 0, and the shift length $\Delta$ approaches the value expressed by the following equation (10):

$$\Delta = \frac{DL_{ML}}{M_0 f - \frac{D_0}{N_0}} \quad (10)$$

Here, the variation of $\Delta$ with respect to the variation of A is expressed by the following equation:

$$\frac{\partial \Delta}{\partial A} = \frac{\partial \Delta}{\partial M} \frac{\partial M}{\partial A} \quad (11)$$

$$= \frac{DL_{ML}f}{\left[(M_0 - M)f - \frac{D_0}{N_0}\right]^2} \times \left(-\frac{M^2}{f}\right)$$

$$= \frac{-DL_{ML}M^2}{\left[(M_0 - M)f - \frac{D_0}{N_0}\right]^2}$$

Since the equation (11) indicating accuracy includes M (=B/A), the accuracy has distance dependence.

(Relationship Between Microlens Images Obtained by Optical System of First Embodiment and Image Re-Formation)

Referring now to FIGS. 5(a) through 5(d), the optical image relationship obtained by the optical system of the first embodiment is described.

Figure 5:
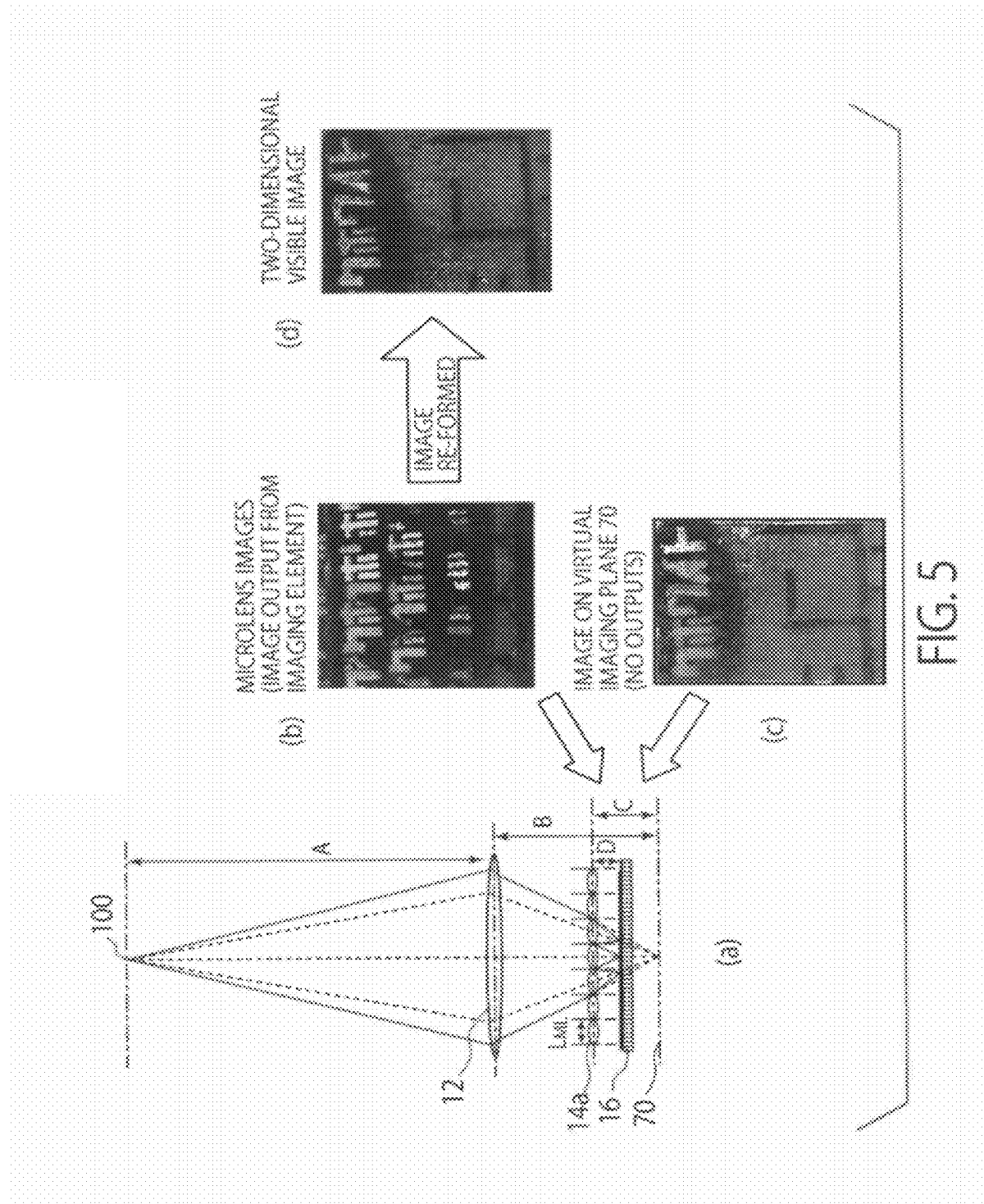
FIGS. 5(a) through 5(d) are diagrams for explaining microlens images obtained by the optical system of the first embodiment and image re-formation.

In a case where microlenses are not provided in the optical system, and the imaging element 16 is located on the virtual imaging plane 70, an image of an object should be formed on the virtual imaging plane 70, as shown in FIG. 5(c). On the other hand, when light rays emitted from the same object are divided by the microlenses 14a to form an image on the surface of the imaging element 16 located before the virtual imaging plane 70 as in this embodiment, two or more images of the same object are captured in accordance with parallaxes caused within the lens aperture. Therefore, images of the same object picked up by the microlenses are output as an image, as shown in FIG. 5(b).

The microlens images shown as an example in FIG. 5(b) indicate an image obtained where uniform-pitch microlenses are arranged in a hexagonal close-packed array. The microlens images shown in FIG. 5(b) are reduced in size from the optical image to be formed on the virtual imaging plane 70, at the imaging magnification N (the equation (4)) of the microlens imaging system. The size reduction rate N serves as the indicator of degradation of the optical resolution, but this will be described later.

The obtained microlens images are re-formed as a two-dimensional image having no overlapping portions as shown in FIG. 5(d), by performing a re-forming operation on read image data of the respective microlenses. The re-forming operation will be described later.

Having the parallaxes within the aperture of the imaging lens 12, the obtained microlens images can also be subjected to a three-dimensional image processing operation using the parallaxes.

(Relationship Between Variation of Microlens Imaging Magnification and Optical Resolution Depending on Distance to Object)

(Difference in ML Imaging Magnification Variation Between a Real Image Optical System and a Virtual Image Optical System)

Figure 6:
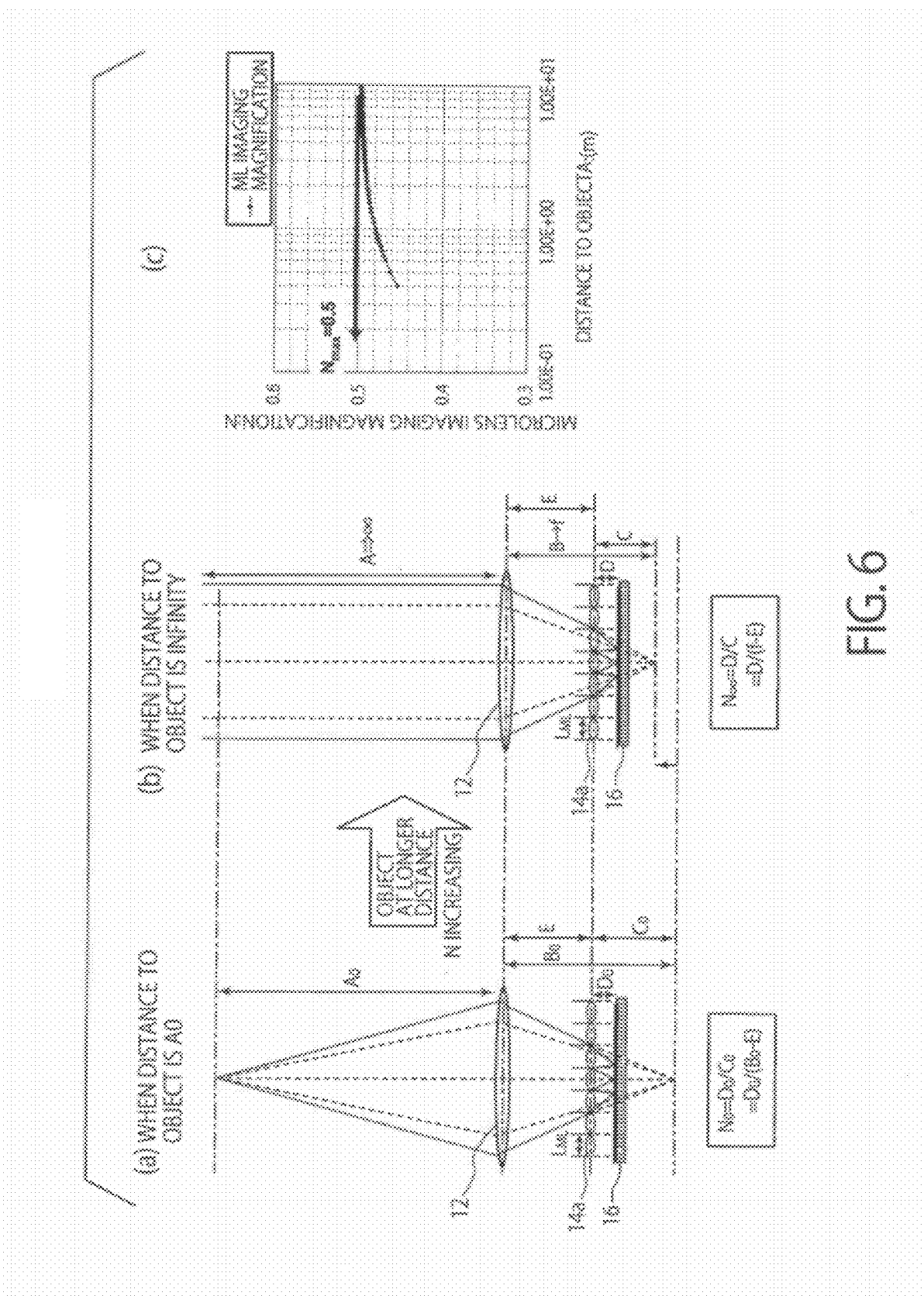
FIGS. 6(a) through 6(c) are diagrams for explaining the correspondence relationship between the distance from the imaging lens to an object and microlens imaging magnification in the first embodiment.

Referring now to FIGS. 6(a) through 6(c), the variation of the microlens imaging magnification with respect to the distance from the imaging lens to an object in the optical system of this embodiment is described.

According to the equation (1), as the distance A from the imaging lens to the object becomes shorter, the imaging length B of the imaging lens 12 becomes longer, and as a result, the virtual imaging plane 70 moves further away from the microlenses 14a. Therefore, the microlens imaging magnification becomes lower according to the following equation:

$$N = D/(B-E)$$

On the other hand, as the distance A from the imaging lens to the object becomes longer, the imaging length B of the imaging lens 12 becomes shorter, and approaches the focal length f of the imaging lens 12. As a result, the virtual imaging plane 70 becomes closer to the plane of the microlenses, and the microlens imaging magnification N becomes higher.

When the object is at an infinite distance, the imaging length B becomes equal to the focal length f of the imaging lens. Therefore, when the object is at an infinite distance, the imaging magnification N∞ is expressed by the following equation:

$$N\infty = D/(f-E)$$

The graph shown in FIG. 6(c) shows the relationship between the distance A from the imaging lens 12 to the object and the imaging magnification (or the image reduction rate) of the microlenses 14a when the imaging magnification N∞ is 0.5, and the focal length f of the imaging lens 12 is 5.0 mm. As the object becomes closer to the imaging lens 12, the virtual imaging plane 70 moves further away from the microlenses 14a, and the microlens imaging magnification N becomes lower.

The optical resolution degradation characteristics of images formed at the imaging magnification N by the microlenses 14a are now described.

When the reduction rate of the microlenses 14a is N, the optical resolution is degraded in proportion to the square of the image reduction rate N for the following reason. The optical sampling frequency is normally the reciprocal of the pixel pitch. In a case where uniform-pitch pixels are used, images reduced with respect to the same sampling size are sampled. Therefore, the vertical pitch and the traverse pitch both become N times larger. Through the multiplication of the vertical pitch and the traverse pitch, the degradation is expressed as N2.

In this embodiment, with respect to microlens images, an image pickup operation needs to be performed at least twice on each object in an overlapping manner. Since the microlens image reduction rate N at which an image pickup operation can be performed at least twice is 0.5 or lower, the microlens image reduction rate N is preferably 0.5 or lower. The theoretically highest optical resolution is {the number of sensor pixels×$(0.5)^2$} or lower.

(Method of Re-Forming Two-Dimensional Visible Image)

Figure 7:
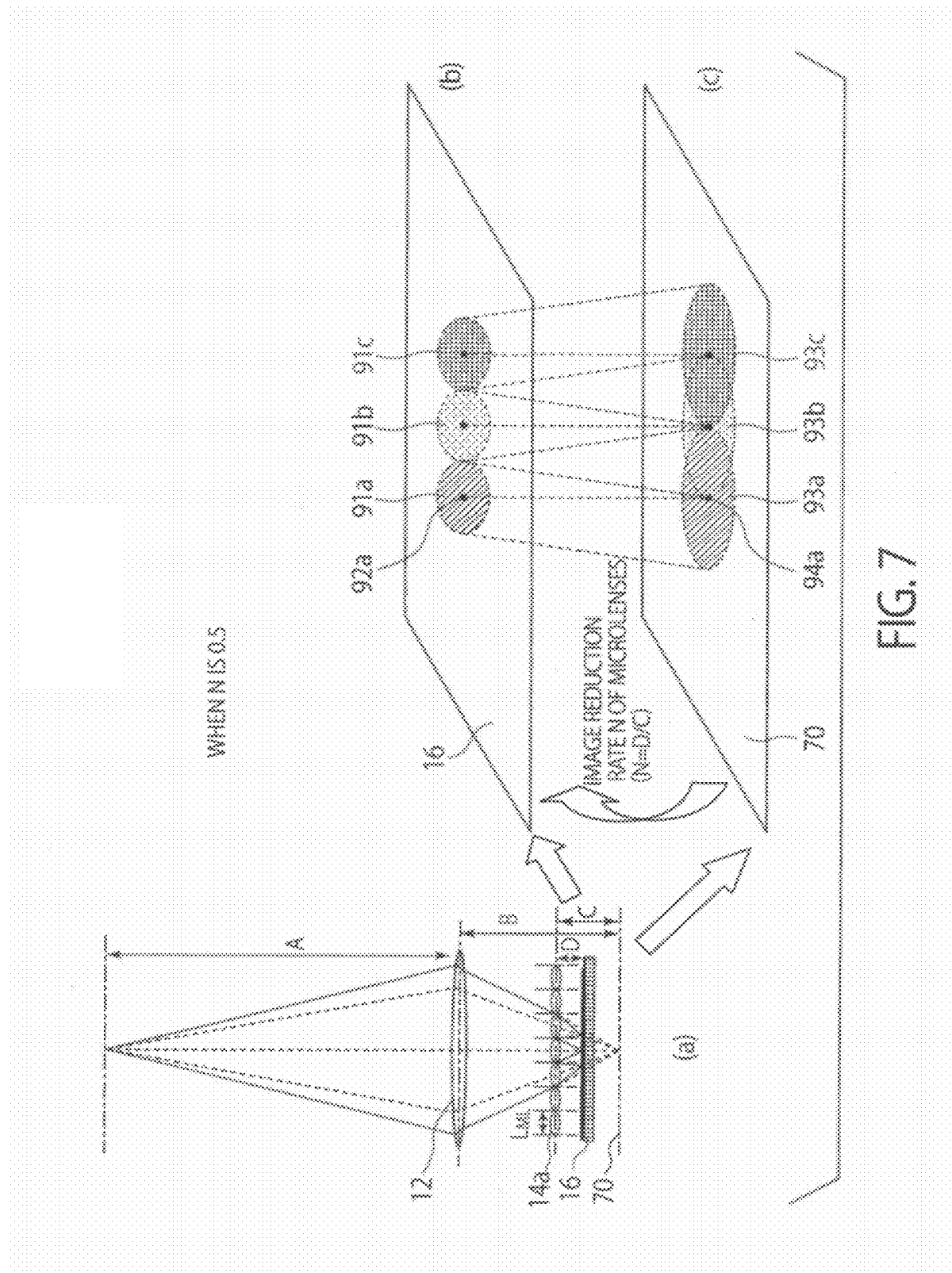
FIGS. 7(a) through 7(c) are diagrams for explaining the relationship of overlapping fields of view among adjacent microlenses.

Referring now to FIGS. 7(a) through 7(c), a method of re-forming a two-dimensional image having no overlapping portions from microlens images formed by picking up images of the same object in an overlapping manner is described.

In this example case, there are three adjacent microlenses, and those microlenses form microlens images 91a, 91b, and 91c, respectively, on the surface of the imaging element 16, as shown in FIG. 7(b). To form such microlens images without any overlapping portions, the F-number of the imaging lens 12 should be nearly equal to the F-number of the microlenses. The fields of view in which the microlens images 91a, 91b, and 91c are formed are equivalent to a field of view 93a, a field of view 93b, and a field of view 93c on the visual imaging plane 70, and those fields of view 93a through 93c on the visual imaging plane 70 are overlapping areas as shown in FIG. 7(c). In the example case illustrated in FIGS. 7(b) and 7(c), the image reduction rate is 0.5. After each field of view becomes 0.5 time larger, an image pickup operation is performed at least twice on each object point. Where the magnification N is 0.5, the image formed on the virtual imaging plane 70 can be reproduced by enlarging each microlens image at a magnification of 1/N or a magnification of 2.

To determine the image reduction rate N from the microlens images after image pickup operations, the following equation (12) that is based on the relationship expressed by the equation (6) is used:

$$N = \frac{D}{C} = \frac{\Delta}{L_{ML}} \quad (12)$$

Since the pitch LML of the microlenses is already known, the image reduction rate N can be determined by calculating the shift length $\Delta$ of the same object from images.

To calculate the shift length $\Delta$ of the same object from images, an image matching operation is performed on adjacent microlens images. In the image matching operation, a known template matching method can be used to check the similarity and difference between two images, for example. To calculate the shift length $\Delta$ with higher precision, the similarities and differences obtained with respect to the respective pixels are interpolated by a continuous fitting function or the like, and sub-pixel positions that define the maximum and the minimum of the fitting function are determined. In this manner, the shift length $\Delta$ can be calculated with even higher precision.

(Method of Obtaining Object Depth-Direction Distance Information)

As described with reference to FIG. 6(c), there is a correlation between the distance A from the imaging lens to an object and the image reduction rate N. Therefore, when the shift length $\Delta$ is calculated from the equation (12) by the above described method, the image reduction rate N is determined, as the pitch LML of the microlenses is a fixed designed value. As a result, the distance A from the imaging lens to the object can be determined.

As described so far, according to the first embodiment, an increase in camera height can be reduced.

Further, images with parallaxes can be obtained through microlenses. Accordingly, various three-dimensional image processing operations using parallax images can be performed.

(Second Embodiment)

Figure 8:
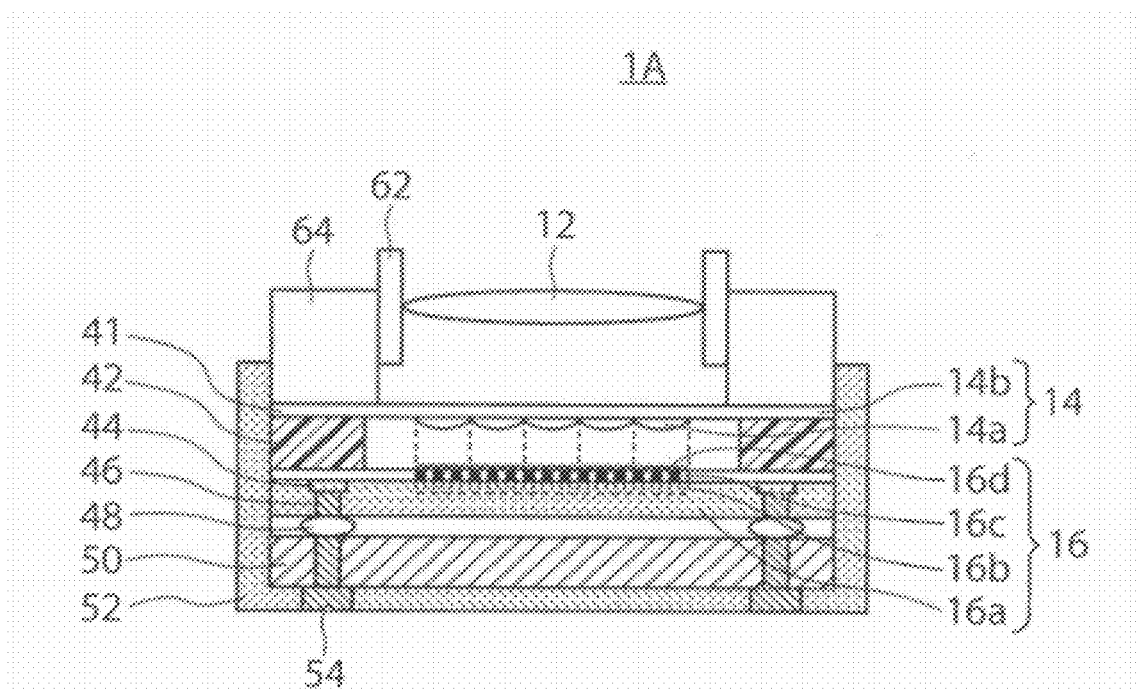
FIG. 8 is a cross-sectional view of a solid-state imaging device according to a second embodiment.

Referring now to FIG. 8, a solid-state imaging device (a camera module) according to a second embodiment is described. FIG. 8 is a cross-sectional view of the solid-state imaging device 1A of the second embodiment. The solid-state imaging device 1A of the second embodiment is the same as the solid-state imaging device 1 of the first embodiment, except that the visible light transmissive substrate 40 is replaced with an optical filter 41. That is, the lens holder 64 supporting the imaging lens 12 and the lens barrel 62 is joined onto the peripheral region of the optical filter 41. The optical filter 41 is a substrate made of a substrate material that transmits visible light (the R, G, and B wavelengths) and cuts off unnecessary near-infrared light, and the microlens array 14 is formed on one side of the substrate. The substrate material of the optical filter 41 may be a material that absorbs unnecessary near-infrared light, or may have a multilayer film or a single-layer film that reflects near-infrared light.

The optical filter substrate 41 having the microlens array 14 formed thereon is positioned so that the microlenses face the imaging element 16.

In the second embodiment, an increase in camera height can be reduced, and images with parallaxes can be obtained through microlenses, as in the first embodiment. Accordingly, various three-dimensional image processing operations using parallax images can also be performed.

Figure 9:
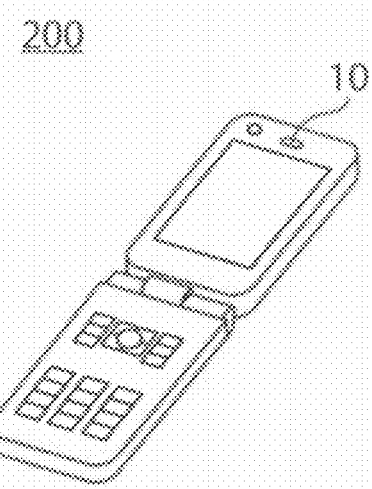
FIG. 9 is a diagram showing an example of a portable information terminal that uses the solid-state imaging device of the first or second embodiment.

The solid-state imaging devices of the first and second embodiments can be applied not only to still cameras but also to a portable information terminal 200 shown in FIG. 9. The portable information terminal shown in FIG. 9 is merely an example, and reference numeral 10 denotes the imaging module of the solid-state imaging device according to the first or second embodiment.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A solid-state imaging device comprising:
an imaging element formed on a semiconductor substrate, and comprising an imaging region including a plurality of pixel blocks each including a plurality of pixels;
a first optical system comprising an imaging lens, the imaging lens forming an image of an object on an imaging plane;
a second optical system comprising a microlens array including a plurality of microlenses each corresponding to one of the pixel blocks, the microlens array reducing and re-forming the image to be formed on the imaging plane on the pixel blocks corresponding to the respective microlenses, the microlenses being semi convex lenses having a convex shape toward the imaging element;

an image signal processor that calculates a shift length of the same object from microlens images and determines a distance from the imaging lens to the same object based on the shift length;

the imaging plane of the first optical system being located further away from the first optical system than the imaging element when the object is located at an infinite distance.

2. The device according to claim 1, wherein the reduction rate of the microlenses is 0.5or lower when the object is located at an infinite distance.

3. The device according to claim 1, wherein the microlens array is formed on a substrate that absorbs or reflects infrared light while transmitting visible light.

4. The device according to claim 1, further comprising color filters on the imaging region, the color filters being provided for the respective pixels.

5. A portable information terminal comprising the solid-state imaging device according to claim 1.

6. The device according to claim 1, wherein the shift length is calculated by performing an image matching operation.

7. The device according to claim 1, wherein the image signal processor determines an image reduction rate based on the shift length and determines the distance from the imaging lens to the object based on the image reduction rate.

8. The device according to claim 1, wherein the plurality of microlenses are arranged in a hexagonal closed-packed array.

9. The device according to claim 1, further comprising a microlens array substrate on which the microlens array is formed.

10. The device according to claim 9, further comprising a spacer provided between the microlens array substrate and the semiconductor substrate, the spacer located around the periphery of the imaging region.

* * * * *